United States Patent [19]

Fukumoto

[11] Patent Number: 4,804,879
[45] Date of Patent: Feb. 14, 1989

[54] DEFLECTING ELECTROMAGNET APPARATUS WITH MOVEABLE POLE PIECE

[75] Inventor: Shintaro Fukumoto, Hyogo, Japan

[73] Assignee: Mitsubishi Denki Kabushiki Kaisha, Tokyo, Japan

[21] Appl. No.: 51,786

[22] Filed: May 20, 1987

[30] Foreign Application Priority Data

May 21, 1986 [JP] Japan .................. 61-114806

[51] Int. Cl.$^4$ .................. H01J 7/24; H05B 31/26
[52] U.S. Cl. .................. 313/361.1; 315/111.81; 250/396 ML; 250/492.3; 335/210; 335/298
[58] Field of Search .................. 313/361.1, 230; 315/111.81; 250/298, 396 R, 396 ML, 423 R, 492.3; 335/210, 298

[56] References Cited

U.S. PATENT DOCUMENTS 3,418,538 12/1968 Roman .................. 335/298 X
4,634,931 1/1987 Taya et al. .................. 250/396 ML

FOREIGN PATENT DOCUMENTS 60-37642 2/1985 Japan .

OTHER PUBLICATIONS

Ion Beams with Applications to Ion Implanation, Wilson and Brewer, 1973, pp. 207–213.
Japanese Magazine "Denshi Gijyutu", vol. 15, No. 6, pp. 117–123.

Primary Examiner—David K. Moore
Assistant Examiner—K. Wieder
Attorney, Agent, or Firm—Sughrue, Mion, Zinn, Macpeak & Seas

[57] ABSTRACT

A deflecting electromagnet having bow-shaped pole pieces 7b,7a disposed at input and output side end surfaces 6b,6a, respectively, of a main pole piece 6 which deflects and focuses an ion beam 2 generated by an ion source 1. The respective bow-shaped pole pieces are rotatably contacted with the side end surfaces of the main pole piece. Wedge-shaped pole pieces 8b,8a, are disposed in freely slidable contact with the planar surfaces of each of the bow-shaped pole pieces, respectively. The deflecting electromagnet constructed as above can be used to easily establish and adjust the effective borders of the magnetic field to a desirable position to establish and adjust, as desired, and the angle of the faces of the deflecting electromagnet at which the ion beam is inputted and outputted.

4 Claims, 1 Drawing Sheet

DEFLECTING ELECTROMAGNET APPARATUS WITH MOVEABLE POLE PIECE

BACKGROUND OF THE INVENTION

This invention relates to a deflecting electromagnet used in a mass separator of an ion-injector.

In general, a mass separator for an ion-injector has a sector magnet or electromagnet for deflecting beams from an ion source at a prescribed angle. A mass separator also has a separating means for selecting ions of prescribed mass number from the beam.

A conventional mass separator or momentum analyzer having a sector magnet arrangement is shown in the plan and side view of FIGS. 1 and 2, respectively. In FIGS. 1 and 2, an ion beam 2 generated and accelerated by a source 1 is injected into a space 30 between a pair of pole pieces 31, 32 of a sector magnet 3. The ion beam is spread out in the direction of the width of a slit 11, as shown by arrow A in FIG. 1, which corresponds to the radial direction of the sector magnet. The expanded beam is then injected through an end face 51 of the pole pieces. The pole pieces are sector shaped, and re-focus the expanded beam at a separating opening 4 on the exit side. The ion beam is also expanded in the direction of the length of the slit 11 as is shown by arrow B in FIG. 2, which corresponds to the axial direction of the sector magnet before its injection into the space 30. In order to focus the axially expanded ion beam on the separating opening 4, its angle of incidence on the end face 51 must be adjusted.

The angle of incidence is adjusted by rotating the end faces 51 and 52 in the directions of the arrows C and D, respectively, by an angle of input edge variation $U_1$ and an angle of output edge variation $U_2$ with respect to the faces or reference planes 51a and 52a. The reference planes are at right angles with the beam 2 at its points of entry into and exit from the space 30, as shown in FIG. 1. It is well known in the optical arts that the ion beam 2 will leave as it was originally a focus on the slit 11 and the separating opening 4., when the end faces 51 and 52 are rotated in the directions of the arrows C and D with respect to the references planes 51a and 52a, respectively. It is also well known that the ion beam 2 will be moved away from focusing on the slit 11 and the separating opening 4 when the end faces 51 and 52 are rotated in the directions opposite to the arrows C and D, respectively. Accordingly, the axially expanded ion beam 2 will be focused on the separating opening 4 when the ion beam 2 is injected into and outputted from the uniform magnetic field in the space 30 between the pole pieces of the sector magnet 3 which has its end faces 51 and 52 positioned at the angles $U_1$ and $U_2$ to the faces 51a and 52a, respectively.

In the above conventional mass separator for an ion-injector, it is important in providing a desirable ion-optical system that the shape and angle of the end faces of the sector magnet be precisely constructed. However, in actuality, the borders of the magnetic field which is generated by the pole pieces generally do not coincide with the respective end faces of the pole pieces. As a result, the expected deflection of the ion beam is affected by the fringe field, i.e. the difference between the borders of the magnetic field and the position of the respective end faces of the pole pieces. Accordingly, in constructing a conventional ion optical system, the borders of the magnetic field are determined by the end faces of the sector magnet and the fringe field of the end faces of the sector magnet.

It is thus necessary to design the conventional deflecting electromagnet, for a mass separator or momentum analyzer, such that the borders of the magnetic field are at desirable positions and angles, so the precise magnetic field distribution is measured and processing or modification of the end faces of the sector magnet is performed repeatedly. Accordingly, a lot of time and effort are needed for the construction of the conventional apparatus. Moreover, even if the borders of the magnetic field are designed at a desirable position and angle for a chosen value of a central magnetic field, the magnetic field distribution will change by the saturation effect about the end faces of the sector magnet when the value of the central magnetic field is varied, the borders of the magnetic field will thereby shift. Furthermore, the beam west point (the beam departure or divergence point) of the ion source 1 will move in the direction of the orbit of the ion beam when the operating condition of the ion source 1 is changed, whereby the focal point of the ion beam will move in the direction of the orbit of the ion beam. Accordingly, it is very difficult to determine the shape of the end face of the sector magnet.

In addition, it has recently been desirable to provide a mass separator for an ion-injector which can inject a greater ion beam current to the target, in order to achieve greater efficiency. Therefore, it is necessary that any loss of ion beam current generated by the ion source be minimized, and that an ion-optical system which can efficiently select the ions of prescribed mass number from the ion beam be provided.

SUMMARY OF THE INVENTION

The present invention solves the above-described problems which arise when using a conventional deflecting electromagnet, as a mass separator of an ion-injector, for example. It is also an object to provide a deflecting electromagnet in which the effective borders of the magnetic field can easily be adjusted to and maintained at a desirable position and in which the face angles of the deflecting electromagnet can easily be adjusted to and maintained at desirable angles.

These objects are accomplished by the provision of a deflecting electromagnet which includes a main pole piece which has an input side end surface for receiving an ion beam and an output side end surface from which the ion beam is outputted, with at least one of the side end surfaces being formed as a curved surface, at least one bow-shaped pole piece has a curved surface disposed in rotatable contact with the curved surface of the main pole piece and has a flat surface, and at least one wedge-shaped pole piece is disposed in slidable contact with the flat surface of the bow-shaped pole piece.

DETAILED DESCRIPTION OF THE PREFERRED EMBODIMENTS

Figure 2:
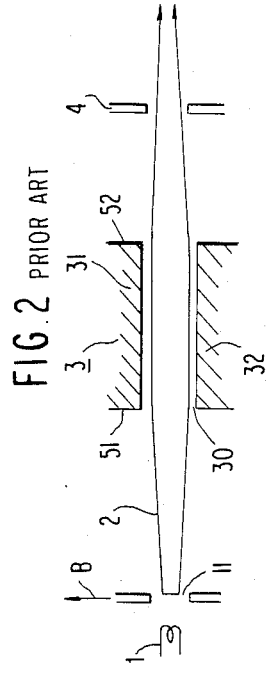
FIG. 2 is a sectional side view of the main part of the conventional deflecting electromagnet shown in FIG. 1.
Figure 1:
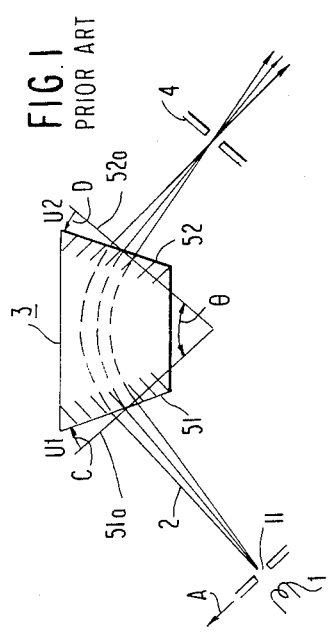
FIG. 1 is a plan view of the main part of a conventional deflecting electromagnet for a mass separator of an ion-injector device.
Figure 3:
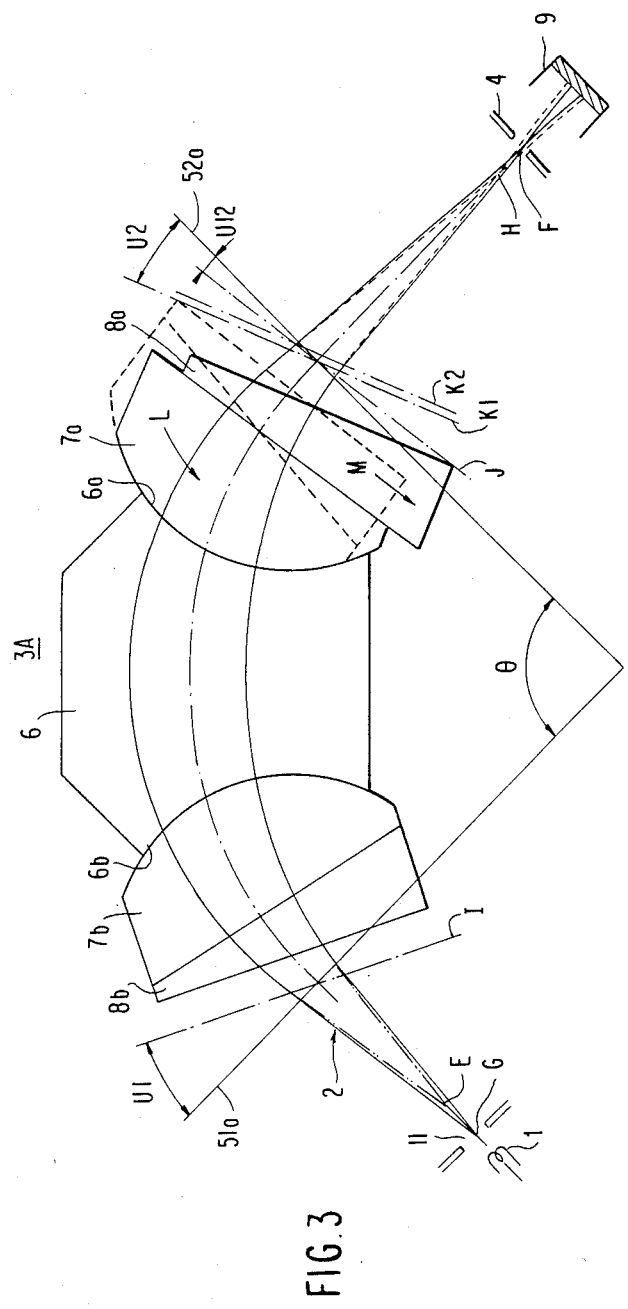
FIG. 3 is a plan view of the main part of a deflecting electromagnet for a mass separator of an ion-injector device in accordance with an embodiment of the present invention.

Referring to FIG. 3, a pair of sector magnets 3A (only one is shown) is formed by a main pole piece 6 with concave faces 6a,6b, bow-shaped pole pieces 7a,7b which are disposed at both sides of the main pole piece 6, respectively, and wedge-shaped pole pieces 8a,8b being disposed at the outside of the bow-shaped pole pieces 7a,7b, respectively. The bow-shaped pole pieces 7a,7b have circular arc faces which are rotatably and closely contacted with the concave faces of the main pole pieces 6, respectively. The wedge-shaped pole pieces 8a,8b are slidably and closely contacted with the planar faces of the bow-shaped pole pieces 7a,7b, respectively. A monitor 9 for monitoring the intensity of the ion beam is disposed at the back of the separating means or separating opening 4.

In operation, an ion beam 2, which is generated and accelerated by an ion source 1, is injected into a space between the pair of sector magnets 3A, then the ion beam is deflected by the sector magnets to thereby focus the beam on a point F in the separating opening 4. In this case, the beam west point (the point of divergence or departure of the beam) is E. The angle of the input and output edge variations are $U_1$, and $U_{12}$ with respect to the reference planes 51a and 52a which are at right angles with the beam 2. The effective borders of the magnetic field are I and J, respectively, as shown in FIG. 3. These effective borders I,J of the magnetic field coincide with the borders which are determined for the ion-optical system. The intensity of the ion beam on the monitor 9 has a maximum, and accordingly the beam transmittance, i.e. the ratio of intensity of the ion beam on the monitor to the intensity of the ion beam generated by the ion source 1, has a maximum.

Now, assume that the operating condition of the ion source 1 is changed to change the ion beam current, and that due to the change the beam west point is moved from the point E to a point G. In this case, the beam focus point is moved from the point F to a point H, and the beam transmittance is reduced too. Therefore, it is necessary to change (to reduce, in the case of FIG. 3) the focusing power of the sector magnet 3A to restore the beam focusing point to its original position F. In order to reduce the focusing power in the radial direction, the angle of the edge variation should be increased. Therefore, the bow-shaped pole piece 7a is rotated in the direction of the arrow L, as shown in FIG. 3, to thereby change the angle of the output edge variation $U_{12}$ to an angle $U_2$. However, at this moment, the effective borders of the magnetic field will be changed from $K_1$ to $K_2$. Therefore, the wedge-shaped pole piece 8a is moved in the direction of the arrow M as shown in FIG. 3 in order to make the current effective border of the magnetic field coincide with the original effective border $K_1$. Consequently, the beam focusing point will again coincide with the point F, and the beam transmittance will become a maximum value.

In general, the adjustment of the focusing power of the sector magnet is easily accomplished, by one of ordinary skill in the art, by adjusting the positions of the bow-shaped pole piece 7a and the wedge-shaped pole piece 8a so that the intensity of the ion beam on the monitor 9 has a maximum value, by appropriate adjustments in accordance with the procedure described above.

While the deflecting electromagnet has been described in the context of a mass separator for an ion-injector device, the present invention is applicable to another type of deflecting electromagnet which can be used for beam deflection and beam focusing.

What is claimed is:

1. A deflecting electromagnet apparatus for deflecting an ion beam (2) generated by an ion source (a) and for focusing the ion beam, the apparatus comprising:
   (a) a main pole piece (6) having an input side end surface (6b) at which the ion beam is received and an output side end surface (6a) at which the ion beam is outputted, at least one of said side end surfaces being formed as a curved surface,
   (b) at least one bow-shaped pole piece (7a,7b) having a planar surface, and having a curved surface for rotatably contacting said curved surface of said main pole piece to change a border of the magnetic field, and
   (c) at least one wedge-shaped pole piece (8a,8b) for contacting said planar surface of said bow-shaped pole piece for slidable movement with respect to said bow-shaped pole piece for reducing the change in the border of the magnetic field, said wedge-shaped pole piece being rotatable with said bow-shaped pole piece.

2. A deflecting electromagnet apparatus according to claim 1, wherein each of said side end surfaces of said main pole piece are formed as curved surfaces, respectively, the number of bow-shaped pole pieces is two, each of said bow-shaped pole pieces being rotatably contacted with said side end surfaces of the main pole piece, respectively, and the number of wedge-shaped pole pieces is two, each of said wedge-shaped pole pieces being slidably contacted with each of said bow-shaped pole pieces, respectively.

3. A deflecting electromagnet apparatus according to claim 1, wherein each of said side end surfaces which are curved are formed as concave surfaces, and said curved surface of said bow-shaped pole piece is a convex surface.

4. A deflecting electromagnet apparatus for deflecting an ion beam generated by an ion source and for focusing the ion beam, the apparatus comprising: a pair of sector magnet, disposed with a space formed therebetween, for generating a magnetic field in the space; and means for directing the ion beam at an input end of the sector magnets and into the space, the ion beam exiting from the space at an output end of the sector magnets, wherein said pair of sector magnets further comprises:
   (a) a main pole piece having an input side end surface disposed facing the input end, and an output side end surface disposed facing the output end, one of said side end surfaces being formed as a curved surface;
   (b) a bow-shaped pole piece having a planar surface, and having a curved surface for rotatably contacting said curved surface of said one of said side end surfaces of said main pole piece to change a border of the magnetic field; and
   (c) a wedge-shaped pole piece having a surface for contacting said planar surface of said bow-shaped pole piece for slidable movement with respect to said bow-shaped pole piece for reducing the change in the border of the magnetic field, and said wedge-shaped pole piece being rotatable with said bow-shaped pole piece.

* * * * *